US012751297B2

(12) United States Patent
Schwab et al.

(10) Patent No.: US 12,751,297 B2
(45) Date of Patent: Sep. 29, 2026

(54) SEMICONDUCTOR DEVICE COMPRISING A LEADFRAME ADAPTED FOR HIGHER CURRENT OUTPUT OR IMPROVED PLACEMENT OF ADDITIONAL DEVICES

(71) Applicant: Infineon Technologies Austria AG, Villach (AT)

(72) Inventors: Stefan Schwab, Singapore (SG); Julian Treu, Munich (DE)

(73) Assignee: Infineon Technologies Austria AG, Villach (AT)

( * ) Notice: Subject to any disclaimer, the term of this patent is extended or adjusted under 35 U.S.C. 154(b) by 407 days.

(21) Appl. No.: 18/374,379

(22) Filed: Sep. 28, 2023

(65) Prior Publication Data

US 2024/0112993 A1 Apr. 4, 2024

(30) Foreign Application Priority Data

Sep. 29, 2022 (EP) ..................................... 22198593

(51) Int. Cl.

*H10W 70/40* (2026.01)
*H10W 72/00* (2026.01)
*H10W 72/50* (2026.01)
*H10W 90/00* (2026.01)

(52) U.S. Cl.

CPC ......... *H10W 70/429* (2026.01); *H10W 90/00* (2026.01); *H10W 90/811* (2026.01); *H10W 72/07553* (2026.01); *H10W 72/07554* (2026.01); *H10W 72/537* (2026.01); *H10W 72/5445* (2026.01); *H10W 72/547* (2026.01); *H10W 72/5473* (2026.01); *H10W 72/5475* (2026.01); *H10W 90/753* (2026.01); *H10W 90/756* (2026.01)

(58) Field of Classification Search

CPC .......... H01L 23/49551; H10W 70/429; H10W 90/811; H10W 70/481; H10W 70/427

See application file for complete search history.

(56) References Cited

U.S. PATENT DOCUMENTS

| | | | | |
|---|---|---|---|---|
| 6,593,622 | B2 * | 7/2003 | Kinzer | H01L 23/4952 257/E23.044 |
| 2004/0217488 | A1 | 11/2004 | Luechinger | |
| 2008/0006437 | A1 | 1/2008 | Reinold et al. | |
| 2009/0072360 | A1 | 3/2009 | Koga | |
| 2009/0146275 | A1 | 6/2009 | Onobuchi et al. | |
| 2013/0323885 | A1 | 12/2013 | Chun | |
| 2017/0103962 | A1 | 4/2017 | Oomae et al. | |
| 2017/0207189 | A1 | 7/2017 | Shi et al. | |
| 2019/0291204 | A1 | 9/2019 | Sijelmassi et al. | |
| 2020/0411420 | A1 * | 12/2020 | Koduri | H01L 25/105 |
| 2023/0275007 | A1 * | 8/2023 | Shibuya | H01L 24/48 257/666 |

* cited by examiner

*Primary Examiner* — Matthew L Reames
(74) *Attorney, Agent, or Firm* — Murphy, Bilak & Homiller, PLLC

(57) ABSTRACT

A semiconductor device comprises a leadframe comprising a die pad and a plurality of leads, a semiconductor die disposed on the die pad, the semiconductor die including a contact pad on a first main face thereof, and one or more bond wires connected with the contact pad, wherein a lead of the plurality of leads is bent back and connected with at least one first bond wire of the one or more bond wires.

13 Claims, 2 Drawing Sheets

SEMICONDUCTOR DEVICE COMPRISING A LEADFRAME ADAPTED FOR HIGHER CURRENT OUTPUT OR IMPROVED PLACEMENT OF ADDITIONAL DEVICES

TECHNICAL FIELD

The present disclosure is related to a semiconductor device comprising a leadframe with a bent back lead for allowing higher current output, a semiconductor device comprising a leadframe with an electrical member connected to end portions of leads for allowing higher current output, and a semiconductor device comprising a leadframe with a bent back lead allowing for placement of an additional device.

BACKGROUND

Wide bandgap devices such as SiC and GaN transistor dies can achieve far higher current density compared to standard Si devices. Therefore, either smaller dies can be used with the same current output, or a higher current output can be achieved with the same size of the die. As a consequence, the interconnections of the device (wires, clips, etc.) must also carry a higher current, which can be limiting for some devices. Investigations of different interconnect options showed that for some cases the area of the leads can be the limiting factor to achieve a high current interconnection. Therefore, a possible way to increase the bondable area of the leads for such devices would be beneficial.

In addition, the integration of passives or other devices into power packages becomes more and more important. As the area of the die pad is often limited, these added devices are sometimes deposited in the lead area as well, further decreasing the free area that can be used for bonding. At the same time, the additional device is thermally decoupled from the die pad, where the power dissipation of the power switch will lead to unfavorable heating. Increasing the area that can be used for bonding is thus beneficial.

There are different ways to increase the current density of interconnects, such as the use of clips, the use of wedge on wedge or wedge-ball-wedge technology. However, these options also come with disadvantages, such as reliability issues.

For these and other reasons there is a need for the present disclosure.

SUMMARY

A first aspect of the present disclosure is related to a semiconductor device, comprising a leadframe comprising a die pad and a plurality of leads, a semiconductor die disposed on the die pad, the semiconductor die comprising a contact pad on a first main face thereof, one or more bond wires connected between the contact pad and a subgroup of the plurality of leads, wherein a lead of the subgroup of the plurality of leads is bent back and connected with at least one first bond wire of the one or more bond wires.

A second aspect of the present disclosure is related to a semiconductor device, comprising a leadframe comprising a die pad, a plurality of leads, and a crossbar connected with a subgroup of the plurality of leads, a semiconductor die disposed on the die pad, the semiconductor die comprising a contact pad on a first main face thereof, one or more bond wires connected between the contact pad and the crossbar, and an electrical member connected to the crossbar in a manner that a portion of the electric member is connected to end portions of the leads.

A general idea of the present disclosure according to the first and second aspects is to increase the active area for wire bonding on a lead frame. There are two possible options to increase the bonding area. The first option, mentioned before as the first aspect, describes in principle the use of an extended lead frame. In this approach, an additional lead frame surface is left over during the stamping process of the lead frame. The additional area is connected to the lead which surface needs to be expanded. The idea of this approach is to have a first wire bonding step which connects the chip(s) with the lead area. After all wire bonds are produced (up to the maximum number of wire bonds possible), the extended area of the lead frame can be bend over in a bend tool, forming a second layer on top of the wire bonds of the first area. This second area can then be used to add additional wire bonds (or to integrate a passive/an additional die). As the additional layer is connected with the lead frame over the bending area, high current throughput to the second layer of wire bonds is possible.

A second possibility to get a similar result is the use of an additional electrical member, e.g. a large ribbon, that is attached on top of the first layer of wire bonds. This large ribbon can be soldered, laser soldered or welded on both edges of the lead. In addition, it is possible to use a laser assisted process to connect the wedge not only to the sides of the lead but also melt the second laver together with the wires on the first layer (similar to the vertical wire approach).

The above options according to the first and second aspects allow either to use an additional layer of wire bonds, but can also be used to integrate an additional device on top of the wires or the electrical member (system integration option).

A third aspect of the present disclosure is related to a semiconductor device, comprising a leadframe comprising a die pad and a plurality of leads, wherein one lead of the plurality of leads is bent back, a semiconductor die disposed on the die pad, the semiconductor die comprising a contact pad on a first main face thereof, further comprising a further device disposed on an upper surface of the bent back lead.

Such a semiconductor device according to the third aspect may be implemented independently of the semiconductor devices according to the first and second aspects. It makes use of the fact that a lead of a lead frame may be connected to one of the contact pads of a semiconductor device by bonding wires and may additionally be bent back to provide an additional area for mounting an additional device thereupon.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

Figure 1:
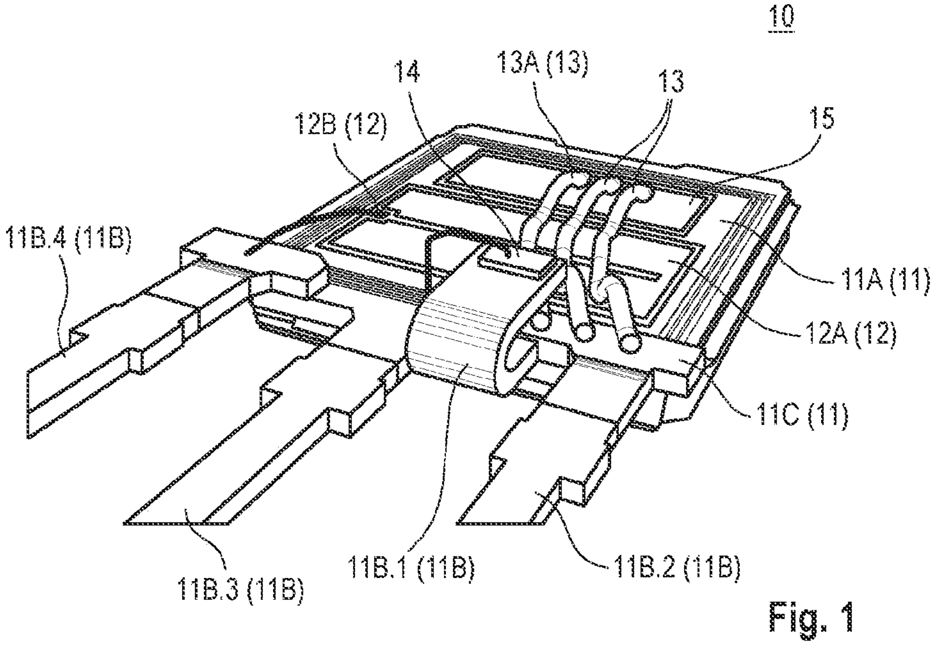
FIG. 1 shows a perspective view on a semiconductor device according to the first aspect, the semiconductor device comprising a leadframe with a bent back lead and an additional device disposed on a surface thereof.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the abovementioned terms may, optionally, also have the specific meaning that the elements or lavers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

FIG. 1 shows a perspective view on a semiconductor device according to the first aspect, the semiconductor device comprising a leadframe with a bent back lead.

More specifically, FIG. 1 shows a semiconductor device 10 comprising a leadframe 11 which comprises a die pad 11A and a plurality of leads 11B, a semiconductor die 12 disposed on the die pad 11A, the semiconductor die 12 comprising a contact pad 12A on a first main face thereof, one or more bond wires 13 connected between the contact pad 12A and a subgroup of the plurality of leads 11B, wherein a lead 11B.1 of the subgroup of the plurality of leads 11B is bent back and connected with at least one first bond wire 13A of the one or more bond wires 13. While only one bent back lead is illustrated in FIG. 1, it is of course contemplated that such a device could include more than one bent back lead without departing from the spirit of invention.

In the embodiment as shown in FIG. 1, the leadframe 11 further comprises a crossbar 11C wherein the subgroup of leads of the plurality of leads 11B is connected with the crossbar 11C. The subgroup is formed by the bent back lead 11B.1 and a further lead 11B.2.

Concerning the fabrication process, bending of the lead 11B.1 will be done after attaching the semiconductor die 12 onto the die pad 11A and connecting the contact pad 12A with the crossbar 11C with the bond wires 13. In order to ensure that the bending of the lead 11B.1 will not induce too much stress on the leadframe 11, the bending area of the lead 11B.1 could be pre-modified during the stamping process of the leadframe 11. Such pre-modification could, for example, be the forming of bending lines into the bending area, e.g. by coining in order to facilitate the bending process.

According to the embodiment of FIG. 1, the semiconductor die is a semiconductor transistor die, in particular a semiconductor power transistor die like, e.g. an IGBT die, and the contact pad is one of a source pad or a drain pad (source-down configuration).

According to the embodiment of FIG. 1, the semiconductor device 10 further comprises a further device 14 disposed on a surface of the bent back lead 11B.1, which surface is remote from the first bond wire 13A.1. According to an example thereof, the further device 14 is one or more of an electrical device, an electronic device, a passive device, an integrated circuit device, or a sensor device.

According to the embodiment of FIG. 1, the semiconductor device 10 further comprises a further lead 11B.3 which is connected with the drain pad of the semiconductor transistor die 12 or with the source pad in a source-down configuration.

According to the embodiment of FIG. 1, the semiconductor device 10 further comprises a further lead 11B.4 which is connected by a bond wire with the gate pad 12B of the semiconductor transistor die 12.

According to the embodiment of FIG. 1, the semiconductor device 10 further comprises a diode die 15 which is electrically connected with the semiconductor transistor die 12.

According to another embodiment of the semiconductor device 10, not shown in FIG. 1, the semiconductor device may further comprise at least one further bond wire connected between the contact pad 12A and the upper surface of the bent back lead. This further bond wire can also be used instead of the further device 15.

Figure 2:
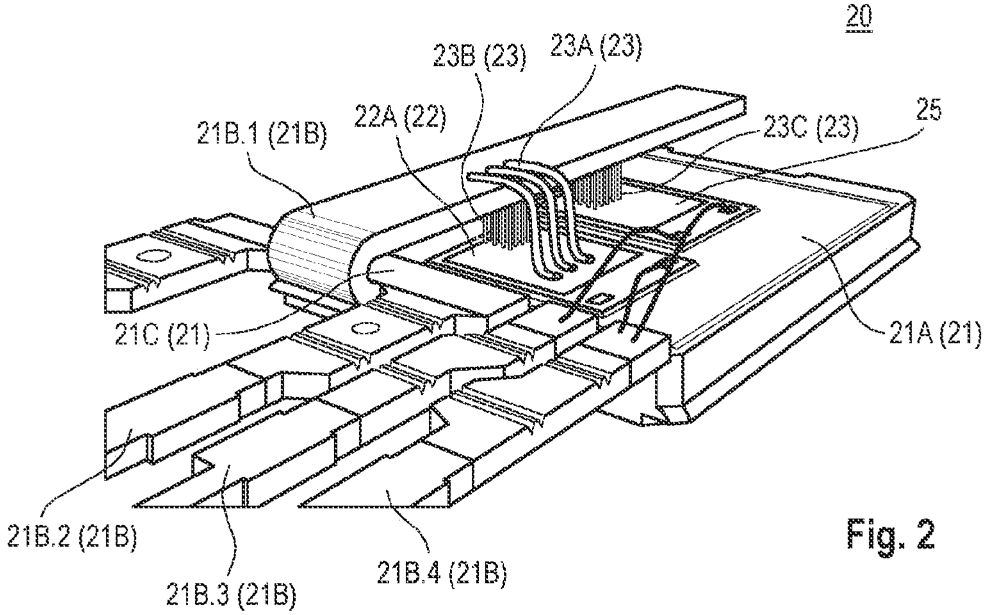
FIG. 2 shows a perspective view on a semiconductor device according to the first aspect, the semiconductor device comprising a leadframe with a bent back lead and additional bond wires connected between the bent back lead and the contact pad of the semiconductor die.

FIG. 2 shows a perspective view on a semiconductor device according to the first aspect, the semiconductor device comprising a leadframe with a bent back lead and additional bond wires connected between the bent back lead and the contact pad of the semiconductor die.

More specifically, FIG. 2 shows a semiconductor device 20 which comprises a leadframe 21 comprising a die pad 21A and a plurality of leads 21B, a semiconductor die 22 disposed on the die pad 21A, the semiconductor die 22 comprising a contact pad 22A on a first main face thereof, one or more bond wires 23 connected with the contact pad 22A, wherein a lead 21B.1 of the subgroup of the plurality of leads 21B is bent back and connected with at least one bond wire 23 of the one or more bond wires 23.

In the embodiment of FIG. 2 the bond wires 23 comprise two groups 23A and 23B wherein a first group 23A of bond wires 23 is connected between the contact pad 22A and an upper surface of the bent back lead 21B.1, and a second group 23B of bond wires 23 is connected between the contact pad 22A and a lower surface of the bent back lead 218.1.

Hence a difference to the embodiment of FIG. 1 is that the upper surface of the bent back lead 21B.1 is not used to place a further device thereupon, but instead to be connected with bond wires 23 of the first group 23A of bond wires. Nevertheless although not shown there is still the possibility to place a further device like the device 14 of FIG. 1 on the upper surface of the bent back lead 21B.1 in addition to the connected bond wires 23.

In the embodiment as shown in FIG. 2, the leadframe 21 further comprises a crossbar 21C wherein a subgroup of leads of the plurality of leads 21B is connected with the crossbar 21C. The subgroup is formed by the bent back lead 21B.1 and a further lead 21B.2.

It should be mentioned that similar to the semiconductor device 10 of FIG. 1, at least one further bond wire could be connected between the contact pad 22A and the cross bar 21C.

Concerning the fabrication process of the semiconductor device 20, the same measures as to the bending of the lead 21B.1 can be taken as were described above in connection with the semiconductor device 10 of FIG. 1.

According to the embodiment of FIG. 2, the semiconductor die 22 is a semiconductor transistor die, in particular a semiconductor power transistor die like, e.g. an IGBT die, and the contact pad 22A is one of a source pad or a drain pad in a source-down configuration.

According to the embodiment of FIG. 2, the semiconductor device 20 further comprises a semiconductor diode die 25 which is electrically connected with the semiconductor transistor die 22. The connection can be accomplished by a third group 23C of bond wires 23 which are connected between an upper contact pad of the diode 25 and a lower surface of the bent back lead 21B.1.

According to the embodiment of FIG. 2, the semiconductor device 20 further comprises two further leads 21B.3 and 21B.4 which can be connected with contact pads of the semiconductor transistor die 22 and the semiconductor diode 25.

Figure 3A:
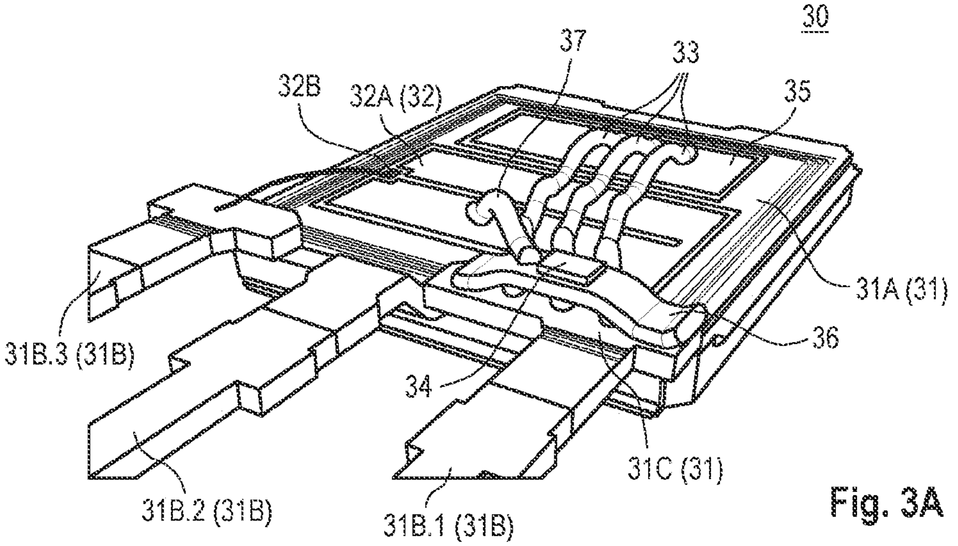
FIG. 3 comprises FIGS. 3A and 3B and shows a top view (FIG. 3A) and a partial cross-sectional side view (FIG. 3B) on a semiconductor device according to the second aspect, the semiconductor device comprising a leadframe comprising an additional electrical member connected to end portions of the leads.
Figure 3B:
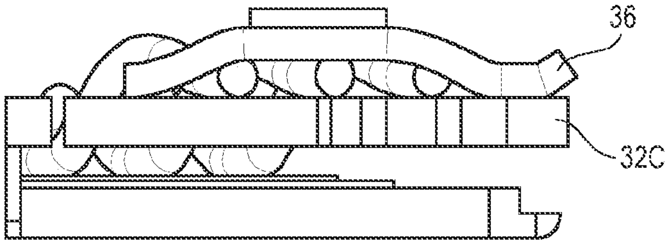

FIG. 3 comprises FIGS. 3A and 3B and shows a top view (A) and a partial cross-sectional side view (B) on a semiconductor device according to the second aspect, the semiconductor device comprising a leadframe comprising an additional electrical member connected to end portions of the leads.

More specifically, the semiconductor device 30 as shown in FIG. 3 comprises a leadframe 31 comprising a die pad 31A, a plurality of leads 31B, and a crossbar 31C connected with a subgroup of the plurality of leads 31B, a semiconductor die 32 disposed on the die pad 31A, the semiconductor die 32 comprising a contact pad 32A on a first main face thereof, one or more bond wires 33 connected between the contact pad 31A and the crossbar 31C, and an electrical member 36 connected to the crossbar 31C in a manner that a portion of the electric member 36 is connected to end portions of the bond wires 33.

In the embodiment as shown in FIG. 1, a subgroup of leads of the plurality of leads 31B is connected with the crossbar 11C. The subgroup is formed by the lead 31B.1.

According to an embodiment the semiconductor device 30 further comprises a further device 34 disposed on an upper surface of the electrical member 36. According to an example thereof, the further device 34 is one or more of an electrical device, an electronic device, a passive device, an integrated circuit device, or a sensor device.

According to an embodiment the semiconductor device 30 further comprises further bond wire 37 connected between the contact pad 32A and the electrical member 36.

According to the embodiment of FIG. 3, the semiconductor die 32 is a semiconductor transistor die, in particular a semiconductor power transistor die like, e.g. an IGBT die, and the contact pad 32A is one of a source pad or a drain pad in a source-down configuration.

According to the embodiment of FIG. 3, the semiconductor device 30 further comprises a further lead 11B.2 which is connected with the drain pad of the semiconductor transistor die 32 or with the source pad in a source-down configuration.

According to the embodiment of FIG. 3, the semiconductor device 30 further comprises a further lead 31B.3 which is connected by a bond wire with the gate pad 32B of the semiconductor transistor die 12.

According to the embodiment of FIG. 3, the semiconductor device 30 further comprises a diode die 35 which is electrically connected with the semiconductor transistor die 32.

Figure 4:
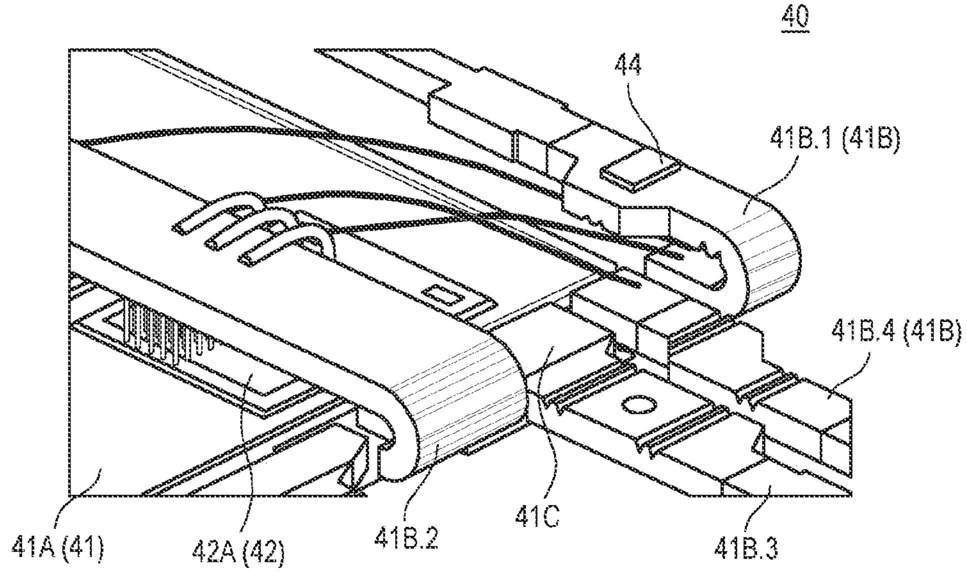
FIG. 4 shows a perspective partial view on a semiconductor device according to the third aspect, the semiconductor device comprising a leadframe with a bent back lead and an additional device disposed on a surface thereof.

FIG. 4 shows a perspective partial view on a semiconductor device according to the third aspect, the semiconductor device comprising a leadframe with a bent back lead and an additional device disposed on a surface thereof.

More specifically, the semiconductor device 40 as shown in FIG. 4 comprises a leadframe 41 comprising a die pad 41A and a plurality of leads 41B, wherein one lead 41B.1 of the plurality of leads 41B is bent back, a semiconductor die 42 disposed on the die pad 41A, the semiconductor die 42 comprising a contact pad 42A on a first main face thereof, further comprising a further device 44 disposed on an upper surface of the bent back lead 41B.1.

According to an embodiment, the further device 44 is one or more of an electrical device, an electronic device, a passive device, an integrated circuit device, or a sensor device.

According to an embodiment, the bent back lead 41B.1 is connected by a bond wire with a gate pad of the semiconductor die 42. The bent-back lead 41B.1 may further be connected to a contact pad of a diode die (not shown), if present, by another bonding wire.

In other respects, the semiconductor device 40 is constructed similarly to the semiconductor device 20 of FIG. 2. In particular, the semiconductor device 40 has a bent-back lead 41B.2 connected to groups of bonding wires 43A and 43B, which in turn are connected to the source or drain pad 42A. The bent-back lead 41B.2 and a further lead 41B.3 are both connected with a crossbar.

In the following specific examples of the present disclosure are described.

Example 1 is a semiconductor device, comprising a leadframe comprising a die pad and a plurality of leads, a semiconductor die disposed on the die pad, the semiconductor die comprising a contact pad on a first main face thereof, and one or more bond wires connected with the contact pad, wherein a lead of the plurality of leads is bent back and connected with at least one first bond wire of the one or more bond wires.

Example 2 is the semiconductor device according to Example 1, wherein the one or more bond wires are connected between the contact pad and a subgroup of the plurality of leads, wherein the bent back lead is one of the subgroup of the plurality of leads.

Example 3 is the semiconductor device according to Example 1 or 2, wherein the semiconductor die is a semiconductor transistor die and the contact pad is one of a source pad or a drain pad.

Example 4 is the semiconductor device according to any one of the preceding Examples, further comprising a further device disposed on a surface of the bent back lead, which surface is facing away from the first bond wire.

Example 5 is the semiconductor device according to Example 4, wherein the further device is one or more of an electrical device, an electronic device, a passive device, an integrated circuit device, or a sensor device.

Example 6 is the semiconductor device according to any one of the preceding Examples, further comprising a bond wire connected between the contact pad and an upper surface of the bent back lead.

Example 7 is the semiconductor device of any one of the preceding Examples, wherein the first semiconductor die comprises a power semiconductor transistor.

Example 8 is the semiconductor device of any one of the preceding Examples, wherein the leadframe further comprises a crossbar wherein the subgroup of leads is connected with the crossbar, and the one or more bond wires are also connected with the crossbar.

Example 9 is a semiconductor device comprising a leadframe comprising a die pad, a plurality of leads, and a crossbar connected with a subgroup of the plurality of leads, a semiconductor die disposed on the die pad, the semiconductor die comprising a contact pad on a first main face thereof, one or more bond wires connected between the contact pad and the crossbar, and an electrical member connected to the crossbar in a manner that a portion of the electric member is connected to end portions of the bond wires.

Example 10 is the semiconductor device according to Example 9, further comprising a further device disposed on an upper surface of the electrical member.

Example 11 is the semiconductor device according to Example 10, wherein the further device is one or more of an electrical device, an electronic device, a passive device, an integrated circuit device, or a sensor device.

Example 12 is the semiconductor device according to any one of Examples 8 to 10, further comprising a further bond wire connected between the contact pad and the electrical member.

Example 13 is a semiconductor device, comprising a leadframe comprising a die pad and a plurality of leads, wherein one lead of the plurality of leads is bent back, a semiconductor die disposed on the die pad, the semiconductor die comprising a contact pad on a first main face thereof, further comprising a further device disposed on an upper surface of the bent back lead.

Example 14 is the semiconductor device according to Example 13, wherein the further device is one or more of an electrical device, an electronic device, a passive device, an integrated circuit device, or a sensor device.

Example 15 is the semiconductor device according to Example 13 or 14, wherein the bent back lead is connected by bond wires with one or both of a gate pad or a source sense pad of the semiconductor die.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device, comprising:

a leadframe comprising a die pad and a plurality of leads;

a semiconductor die disposed on the die pad, the semiconductor die comprising a contact pad on a first main face thereof; and one or more bond wires connected with the contact pad; wherein a lead of the plurality of leads is bent back such that in a bent back section of the lead a lower surface of the lead overlaps with and faces the leadframe and such that an upper surface of the lead that is opposite from the lower surface of the lead in the bent back section faces away from the lead frame, and wherein at least one first bond wire of the one or more bond wires is attached to the upper surface of the lead in the bent back section that is opposite from the lower surface.

2. The semiconductor device according to claim 1, wherein the one or more bond wires are connected between the contact pad and a subgroup of the plurality of leads, wherein the bent back lead is one of the subgroup of the plurality of leads.

3. The semiconductor device according to claim 1, wherein the semiconductor die is a semiconductor transistor die and the contact pad is one of a source pad or a drain pad.

4. The semiconductor device according to claim 1, further comprising a further device disposed on a surface of the the upper surface of the lead in the bent back section.

5. The semiconductor device according to claim 4, wherein the further device is one or more of an electrical device, an electronic device, a passive device, an integrated circuit device, or a sensor device.

6. The semiconductor device of claim 1, wherein the semiconductor die comprises a power semiconductor transistor.

7. The semiconductor device of claim 2, wherein the leadframe further comprises a crossbar wherein the subgroup of leads is connected with the crossbar, and the one or more bond wires are also connected with the crossbar.

8. A semiconductor device, comprising:

a leadframe comprising a die pad, a plurality of leads, and a crossbar connected with a subgroup of the plurality of leads;

a semiconductor die disposed on the die pad, the semiconductor die comprising a contact pad on a first main face thereof;

one or more bond wires connected between the contact pad and the crossbar; and an electrical member connected to the crossbar in a manner that a portion of the electric member is connected to end portions of the bond wires, wherein the electrical member is attached exclusively with an upper side of the crossbar.

9. The semiconductor device according to claim 8, further comprising a further device disposed on an upper surface of the electrical member.

10. The semiconductor device according to claim 9, wherein the further device is one or more of an electrical device, an electronic device, a passive device, an integrated circuit device, or a sensor device.

11. The semiconductor device according to claim 8, further comprising a further bond wire connected between the contact pad and the electrical member.

12. A semiconductor device, comprising:

a leadframe comprising a die pad and a plurality of leads, wherein a first lead of the plurality of leads is bent back and a second lead of the plurality of leads is bent back such that in a bent back section of the second lead a lower surface of the second lead overlaps with and faces the leadframe and such that an upper surface of the second lead that is opposite from the lower surface of the second lead in the bent back section faces away from the lead frame;

a semiconductor die disposed on the die pad, the semiconductor die comprising a contact pad on a first main face thereof; further comprising a further device disposed on an upper surface of the first lead, wherein the second lead is connected by bond wires with one or both of a gate pad or a source sense pad of the semiconductor die, and wherein the bond wires are attached to the upper surface of the second lead in the bent back section that is opposite from the lower surface.

13. The semiconductor device according to claim 12, wherein the further device is one or more of an electrical device, an electronic device, a passive device, an integrated circuit device, or a sensor device.

* * * * *